(12) United States Patent
Rickerby

(10) Patent No.: US 6,183,884 B1
(45) Date of Patent: *Feb. 6, 2001

(54) METALLIC ARTICLE HAVING A THERMAL BARRIER COATING AND A METHOD OF APPLICATION THEREOF

(75) Inventor: David S Rickerby, Derby (GB)

(73) Assignees: Rolls-Royce PLC, London; Chromalloy United Kingdom Limited, Nottingham, both of (GB)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/211,317

(22) Filed: Dec. 16, 1998

(30) Foreign Application Priority Data

Jan. 13, 1998 (GB) .................................... 9800511

(51) Int. Cl.$^7$ .......................... B32B 15/04; B32B 18/00; B21D 39/00; C23C 16/00
(52) U.S. Cl. .......................... 428/623; 428/141; 428/148; 428/629; 428/632; 428/633; 428/635; 428/670; 428/678; 416/241 B; 427/248.1; 427/255.19; 427/566; 427/567
(58) Field of Search .................................... 428/141, 148, 428/623, 629, 632, 633, 635, 670, 678; 416/241 B; 427/248.1, 255.19, 566, 567

(56) References Cited

U.S. PATENT DOCUMENTS

| | | |
|---|---|---|
| 4,764,089 * | 8/1988 | Strangman ........................ 415/174 |
| 5,350,599 | 9/1994 | Rigney et al. . |
| 5,624,721 | 4/1997 | Strangman . |
| 5,652,044 * | 7/1997 | Rickerby .............................. 428/216 |
| 5,876,860 | 3/1999 | Marijnissen et al. . |

FOREIGN PATENT DOCUMENTS

| | | |
|---|---|---|
| 0 718 419 A2 | 6/1966 | (EP) . |
| 0 718 420 A1 | 6/1996 | (EP) . |
| 0 733 723 A1 | 9/1996 | (EP) . |
| WO 93/18199 | 9/1993 | (WO) . |
| WO 97/218848 | 6/1997 | (WO) . |
| WO 99/65626 | 12/1999 | (WO) . |

* cited by examiner

*Primary Examiner*—Timothy M. Speer
*Assistant Examiner*—Bryant Young
(74) *Attorney, Agent, or Firm*—Oliff & Berridge, PLC

(57) ABSTRACT

A metallic article includes a bond coating and a ceramic thermal barrier coating on the bond coating. The ceramic thermal barrier coating includes a plurality of columnar grains, which extend perpendicularly to the surface of the metallic article. Each columnar grain includes a plurality of layers. Some of the layers include sub-grains extending at an acute angle to the surface of the metallic article to form voids between adjacent sub-grains. The voids are arranged at an acute angle to the surface of the metallic article and reduce the thermal conductivity of the ceramic thermal barrier coating. Some of the layers include sub-grains extending perpendicularly to the surface of the metallic article to provide erosion resistance.

37 Claims, 6 Drawing Sheets

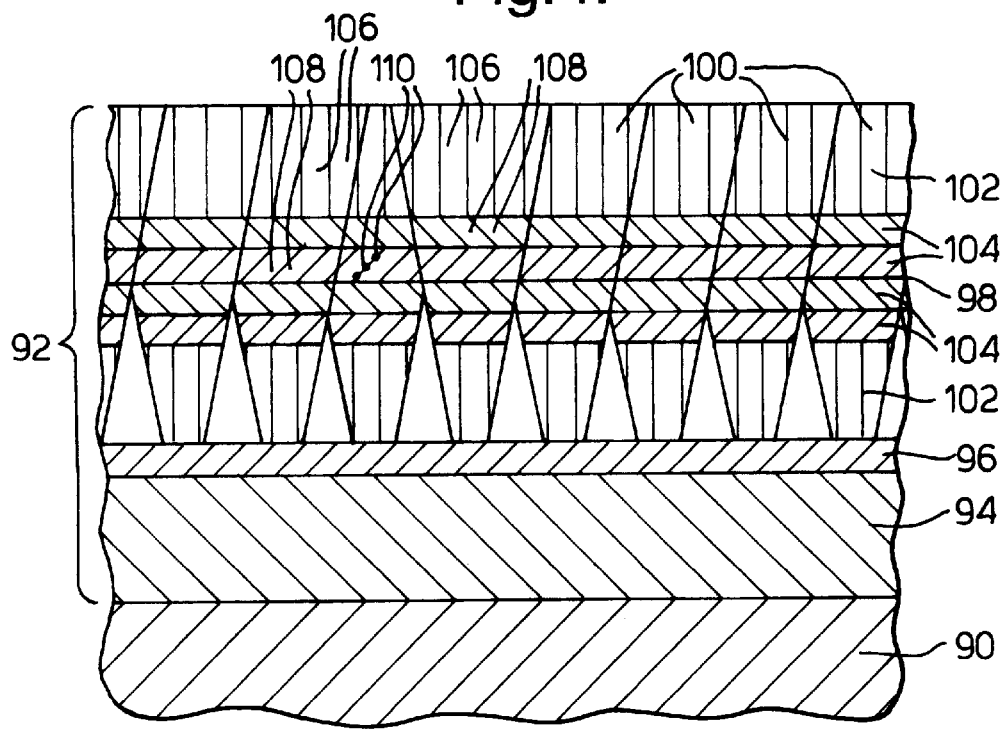
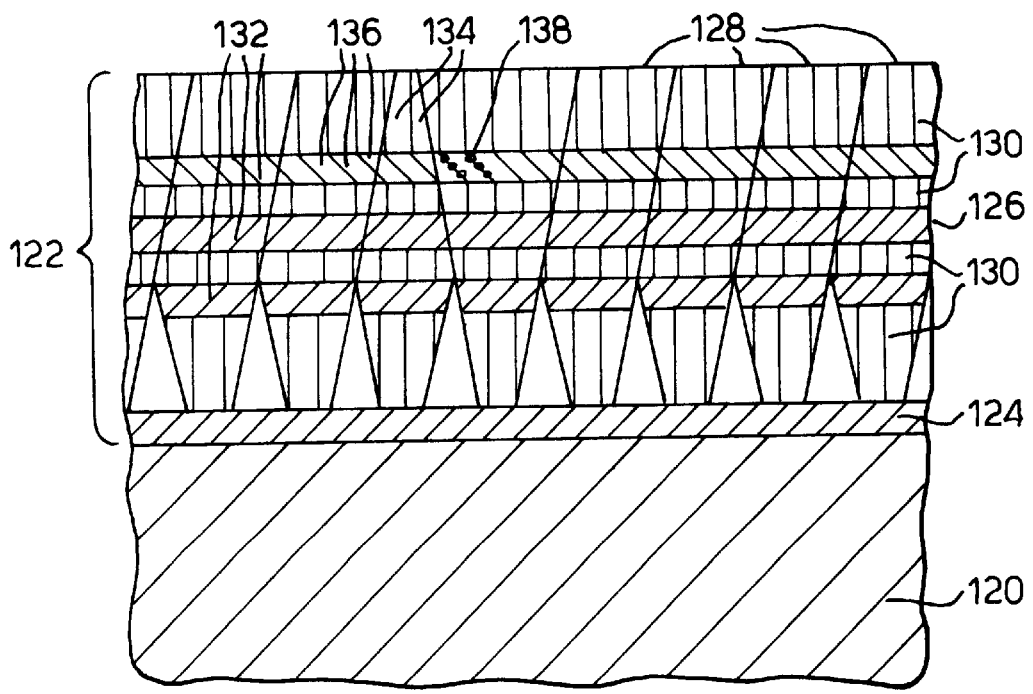

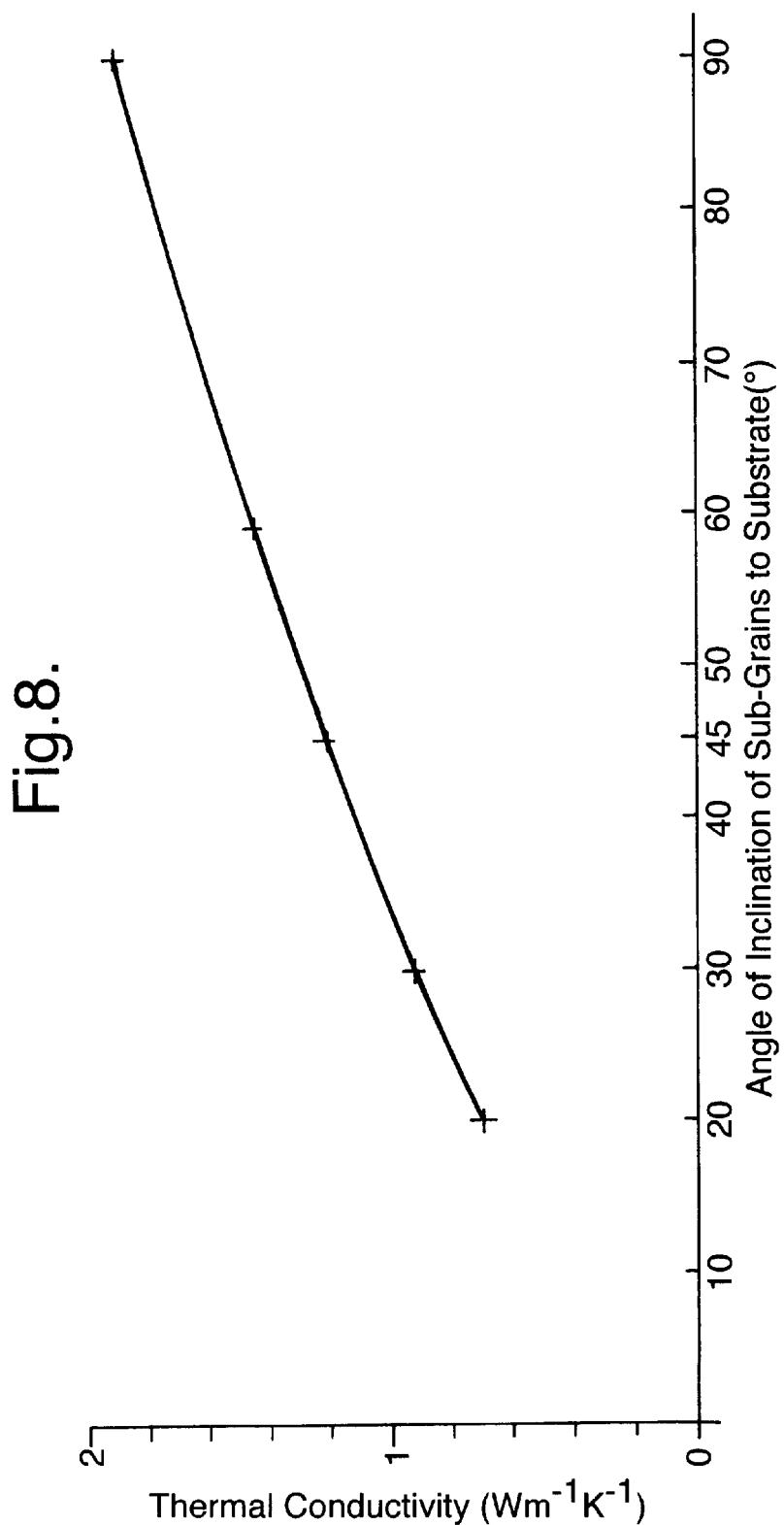

METALLIC ARTICLE HAVING A THERMAL BARRIER COATING AND A METHOD OF APPLICATION THEREOF

BACKGROUND OF THE INVENTION

The present invention relates to a thermal barrier coating applied to the surface of a superalloy article e.g. a gas turbine engine turbine blade, and to a method of applying the thermal barrier coating. The invention particularly relates to ceramic thermal barrier coatings.

The constant demand for increased operating temperature in gas turbine engines was initially met by air cooling of the turbine blades and turbine vanes and the development of superalloys from which to manufacture the turbine blades and turbine vanes, both of which extended their service lives.

Further temperature increases necessitated the development of ceramic coating materials with which to insulate the turbine blades and turbine vanes from the heat contained in the gases discharged from the combustion chambers, again the operating lives of the turbine blades and turbine vanes was extended.

It is known in the prior art to apply these ceramic coating materials by the thermal, or plasma, spray process onto a suitable bond coating, for example a MCrAlY alloy bond coating, which has been applied to the metallic substrate.

It is also known in the prior art to apply these ceramic coating materials by the physical vapour deposition process onto a suitable bond coating which has an alumina interface layer, for example a MCrAlY alloy bond coating or a diffusion aluminide bond coating, which has been applied to the metallic substrate.

It is also known in the prior art to apply these ceramic coating materials by plasma spraying or physical vapour deposition processes onto an oxide layer on the metallic substrate.

The ceramic thermal barrier coatings deposited by the physical vapour deposition process have benefits over the ceramic thermal barrier coating deposited by plasma spraying. The main benefit is improved thermal shock resistance due to the columnar structure of the ceramic thermal barrier coating produced by the physical vapour deposition process.

One problem associated with thermal barrier coatings produced by physical vapour deposition is that the the thermal conductivity is greater than the thermal conductivity of the same thermal barrier coating produced by plasma spraying.

It is known from International patent application WO9318199A to produce a columnar ceramic thermal barrier coating which comprises a plurality of layers with interfaces between the adjacent layers. Each columnar grain extends perpendicularly to the surface of the metallic article. Each columnar grain has a plurality of layers and adjacent layers have different structures. The interfaces between adjacent layers decreases the thermal conductivity of the ceramic thermal barrier coating. These layers are produced by alternate physical vapour deposition and plasma assisted physical vapour deposition.

SUMMARY OF THE INVENTION

The present invention seeks to provide a metallic article having a columnar ceramic thermal barrier coating in which the ceramic thermal barrier coating has reduced thermal conductivity. The present invention also seeks to provide a method of applying a ceramic thermal barrier coating by physical vapour deposition to produce a columnar ceramic thermal barrier coating which has reduced thermal conductivity.

Accordingly the present invention provides a metallic article comprising a bond coating on the metallic article and a ceramic thermal barrier coating on the bond coating, the ceramic thermal barrier coating comprising a plurality of columnar grains extending substantially perpendicularly to the surface of the metallic article, each columnar grain having a plurality of layers having sub-grains extending at an acute angle to the surface of the metallic article to form voids between adjacent sub-grains, the voids being arranged at an acute angle to the surface of the metallic article and thereby reduce the thermal conductivity of the ceramic thermal barrier coating.

Preferably each columnar grain has at least one further layer having sub-grains extending perpendicularly to the surface of the article, the at least one layer having sub-grains extending perpendicularly to the surface of the article being arranged further from the surface of the article than the plurality of layers having sub-grains extending at an acute angle to the surface of the article to increase the erosion resistance of the ceramic thermal barrier coating.

Preferably there are a plurality of layers having sub-grains extending at an acute angle to the surface of the metallic article to form voids between adjacent sub-grains and a plurality of layers having sub-grains extending perpendicularly to the surface of the metallic article.

Preferably the layers having sub-grains extending at an acute angle to the surface of the metallic article to form voids between adjacent sub-grains are arranged alternately with the further layers having sub-grains extending perpendicularly to the surface of the metallic article.

The sub-grains in adjacent layers with sub-grains extending at an acute angle to the surface of the metallic article may be arranged at different angles. The sub-grains in adjacent layers with sub-grains extending at an acute angle to the surface of the metallic article may be arranged at progressively decreasing acute angles.

Preferably the sub-grains in the at least one layer having sub-grains extending at an acute angle to the surface of the metallic article are arranged at an angle between 10° and 60°, more preferably at an angle between 20° and 45°, preferably at an angle of 30°.

Preferably the bond coating comprises an aluminium containing bond coating on the metallic article, the aluminium containing bond coating has an alumina surface layer, the ceramic thermal barrier coating is arranged on the alumina layer.

The aluminium containing bond coating may comprise a CrAlY bond coating or a diffusion aluminide coating.

Preferably the bond coating comprises a MCrAlY bond coating on the metallic article, a platinum enriched MCrAlY layer on the MCrAlY bond coating, a platinum aluminide layer on the platinum enriched MCrAlY layer, the platinum aluminide layer has an alumina surface layer, the ceramic thermal barrier coating is arranged on the alumina layer.

Alternatively the metallic article has an alumina surface layer, the ceramic thermal barrier coating is arranged on the alumina layer.

The metallic article may comprise a nickel superalloy article or a cobalt superalloy article.

The metallic article may comprise a turbine blade or a turbine vane.

The ceramic thermal barrier coating may comprise zirconia. The zirconia may be stabilised with yttria.

The present invention also provides a method of applying a ceramic thermal barrier coating to a metallic article, comprising the steps of: forming a bond coating on the metallic article, applying a ceramic thermal barrier coating to the bond coating by vapour deposition such that a plurality of columnar grains extend substantially perpendicularly to the surface of the metallic article, the vapour deposition process including a first deposition mode comprising depositing the ceramic such that a plurality of layers are formed in each columnar ceramic grain, the plurality of layers have sub-grains extending at an acute angle to the surface of the metallic article to form voids between adjacent sub-grains, the voids being arranged at an acute angle to the surface of the metallic article and thereby reduce the thermal conductivity of the ceramic thermal barrier coating.

Preferably the vapour deposition process includes a second mode comprising depositing the ceramic such that at least one further layer is formed in each columnar ceramic grain, the at least one further layer having sub-grains extending perpendicularly to the surface of the article, the at least one further layer having sub-grains extending perpendicularly to the surface of the article being arranged further from the surface of the article than the plurality of layers having sub-grains extending at an acute angle to the surface of the article to increase the erosion resistance of the ceramic thermal barrier coating.

Preferably the method comprises depositing a plurality of layers having sub-grains extending at an acute angle to the surface of the metallic article to form voids between adjacent sub-grains and depositing a plurality of further layers having sub-grains extending perpendicularly to the surface of the metallic article.

Preferably the method comprises depositing the plurality of layers having sub-grains extending at an acute angle to the surface of the metallic article to form voids between adjacent sub-grains alternately with the plurality of further layers having sub-grains extending perpendicularly to the surface of the metallic article.

The method may comprise depositing the sub-grains in adjacent layers with sub-grains extending at an acute angle to the surface of the metallic article at different angles.

The method may comprise depositing the sub-grains in adjacent layers with sub-grains extending at an acute angle to the surface of the metallic article at progressively decreasing acute angles.

Preferably the sub-grains in the at least one layer having sub-grains extending at an acute angle to the surface of the metallic article are arranged at an angle between 10° and 60°, more preferably at an angle between 20° and 45°, preferably at an angle of 30°.

Preferably the method comprises tilting the metallic article such that the surface of the metallic article is at an acute angle to the flux of ceramic vapour to produce a plurality of layers having sub-grains extending at an acute angle to the surface of the metallic article to form voids between adjacent sub-grains.

Preferably the method comprises arranging the metallic article such that the surface of the metallic article is perpendicular to the flux of ceramic vapour to produce layers having sub-grains extending perpendicularly to the surface of the metallic article.

The method may comprise applying an aluminium containing bond coating on the metallic article and forming an alumina layer on the aluminium containing bond coating.

The aluminium containing bond coating may comprise a MCrAlY alloy, an aluminide or a platinum aluminide.

The method may comprise applying a MCrAlY bond coating on the metallic article, forming a platinum enriched MCrAlY layer on the MCrAlY bond coating, forming a platinum aluminide layer and on the platinum enriched MCrAlY layer, forming an alumina surface layer on the platinum aluminide layer.

The method may comprise forming an alumina surface layer on the metallic article.

The metallic article may be formed from a nickel superalloy article or a cobalt superalloy article.

The metallic article may comprise a turbine blade or a turbine vane.

The ceramic thermal barrier coating may comprise zirconia, preferably zirconia stabilised with yttria.

BRIEF DESCRIPTION OF THE DRAWINGS

The present invention will be more fully described by way of example with reference to the accompanying drawings, in which:

FIG. 4 is a cross-sectional diagrammatic view through a metallic article having a further thermal barrier coating according to the present invention, FIG. 5 is a cross-sectional diagrammatic view through a metallic article having a further thermal barrier coating according to the present invention.

FIG. 8 is a graph showing thermal conductivity of the ceramic thermal barrier coating against angle of inclination of sub-grains in a columnar ceramic grain.

DETAILED DESCRIPTION OF THE PREFERRED EMBODIMENTS

Figure 1:
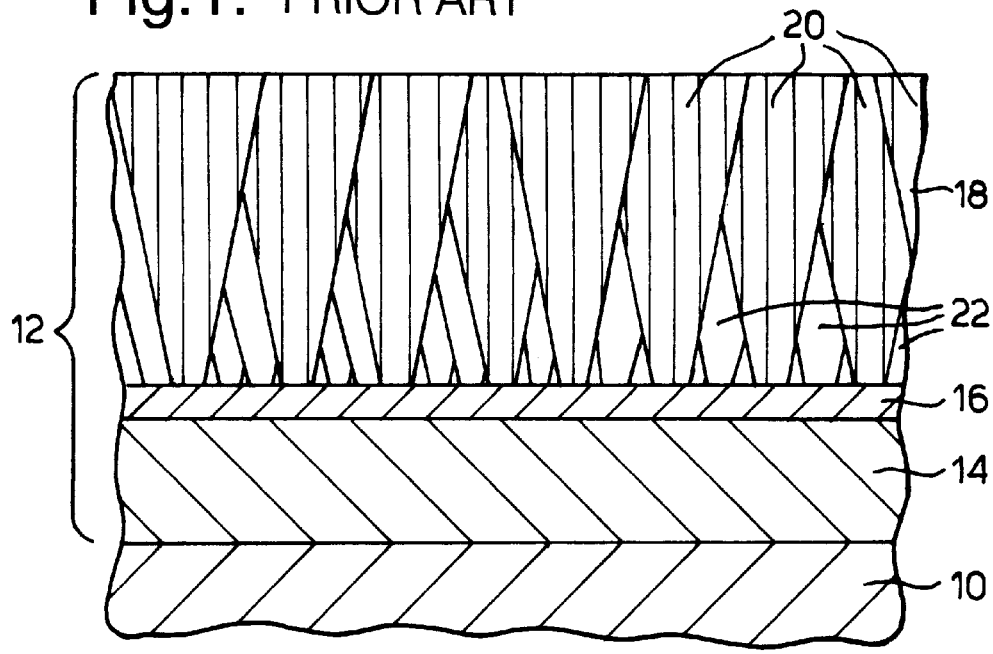
FIG. 1 is a cross-sectional diagrammatic view through a metallic article having a thermal barrier coating according to the prior art.

Referring to FIG. 1, illustrating the prior art, there is shown part of a superalloy article 10 provided with a multi-layer thermal barrier coating indicated generally by numeral 12. It is shown in the as manufactured condition. The thermal barrier coating 12 comprises a bond coating 14 on the superalloy substrate 10, an oxide layer 16 on the bond coating 14 and a ceramic thermal barrier coating 18 on the oxide layer 16. The bond coating 14 is generally an aluminium containing alloy for example a MCrAlY alloy where M is at least one of Ni, Co and Fe, a nickel aluminide, a cobalt aluminide or a platinum aluminide. The oxide layer generally comprises alumina together with other oxides.

The ceramic thermal barrier coating 18 comprises a plurality of columnar ceramic grains 20 which extend substantially perpendicularly to the surface of the superalloy substrate 10.

It has been found that the thermal conductivity of the prior art columnar ceramic thermal barrier coating 18 is greater than the thermal conductivity of prior art plasma sprayed ceramic thermal barrier coatings.

The multi-layer thermal barrier coating 12 is applied on the superalloy article 10 by firstly depositing a MCrAlY alloy bond coating 14 by plasma spraying or physical vapour deposition or forming a nickel aluminide bond coating 14 by diffusion aluminising or forming a platinum aluminide bond coating 14 by platinum modified diffusion aluminising. The ceramic thermal barrier coating 18 is then applied onto the bond coating 14 by physical vapour deposition, usually electron beam physical vapour deposition. The oxide layer 16 forms on the bond coating 14 while the superalloy article 10 is heated up to the operating temperature in an electron beam physical vapour deposition chamber due to the presence of oxygen. The superalloy article 10 is rotated in the electron beam physical vapour deposition chamber in the ceramic vapours to produce the ceramic thermal barrier coating 18.

Figure 2:
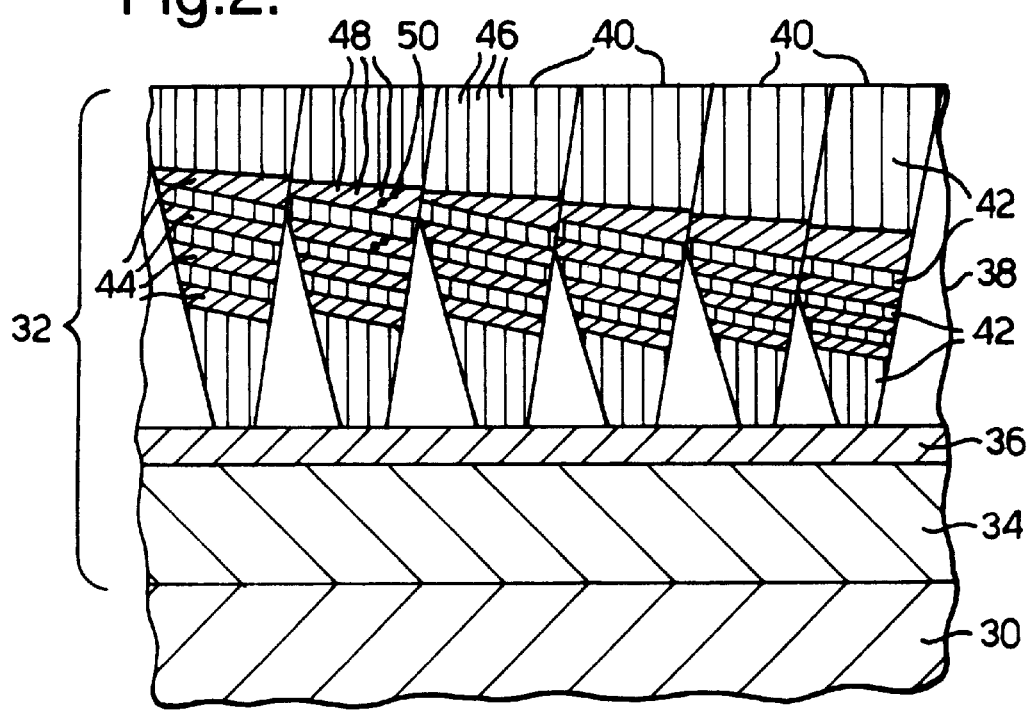
FIG. 2 is a cross-sectional diagrammatic view through a metallic article having a thermal barrier coating according to the present invention.

Referring to FIG. 2, illustrating the present invention, there is shown part of a superalloy article 30 provided with a multi-layer thermal barrier coating indicated generally by numeral 32. It is shown in the as manufactured condition. The thermal barrier coating 32 comprises a bond coating 34 on the superalloy substrate 30, an oxide layer 36 on the bond coating 34 and a ceramic thermal barrier coating 38 on the oxide layer 36. The bond coating 34 is generally an aluminium containing alloy for example a MCrAlY alloy where M is at least one of Ni, Co and Fe, a nickel aluminide, a cobalt aluminide or a platinum aluminide. The oxide layer generally comprises alumina together with other oxides.

Figure 2A:
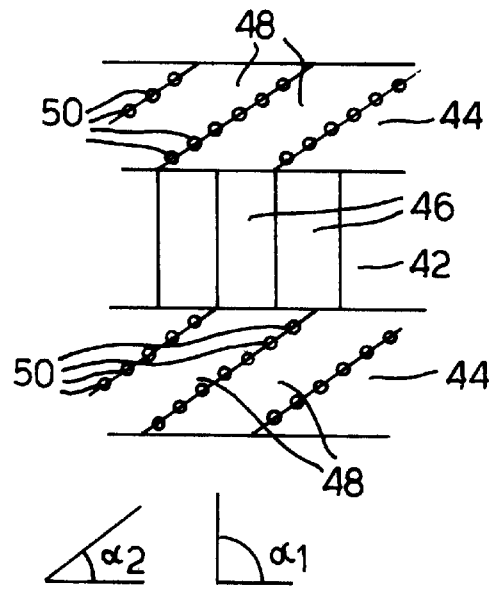
FIG. 2A is an enlarged view of a portion of the thermal barrier coating shown in FIG. 2.

The ceramic thermal barrier coating 38 comprises a plurality of columnar ceramic grains 40 which extend substantially perpendicularly to the surface of the superalloy substrate 30. Furthermore it is seen that each columnar ceramic grain 40 comprises a plurality of layers 42 and 44. The sub grains 46 in the layers 42 extend substantially perpendicularly, at an angle alpha 1, to the surface of the superalloy substrate 30 and the sub-grains 48 in the layers 44 extend at an acute angle, alpha 2, to the surface of the superalloy substrate 30. Additionally voids 50, or pores, are formed between the adjacent sub-grains 48 in the layers 44, which are shown more clearly in FIG. 2A, and the voids 50 are arranged at the same acute angle, alpha 2, to the surface of the superalloy substrate. The differences in structure between the layers 42 and 44 produces interfaces which reduce the thermal conductivity of the ceramic thermal barrier coating 38. The thickness of the layers is selected to reduce either the phonon thermal conductivity or the photon thermal conductivity. Additionally the voids 50 between adjacent sub-grains 48 in the layers 44 reduce phonon thermal conductivity of the ceramic thermal barrier coating 18. The layers 42 and 44 are arranged alternately to provide good erosion resistance, with a thicker final layer 44.

It has been found that the thermal conductivity of the columnar ceramic thermal barrier coating 38 according to the present invention has lower thermal conductivity than a prior art columnar ceramic thermal barrier coating 18 in FIG. 1.

It is believed that the presence of the voids 50 between adjacent sub-grains 48 shortens the mean free path length of a phonon and hence reduces the phonon thermal conductivity of the columnar ceramic thermal barrier coating 38.

The multi-layer thermal barrier coating 32 is applied on the superalloy article 30 by firstly depositing a MCrAlY alloy bond coating 34 by plasma spraying or physical vapour deposition or forming a nickel aluminide bond coating 34 by diffusion aluminising or forming a platinum aluminide bond coating 34 by platinum modified diffusion aluminising. The ceramic thermal barrier coating 38 is then applied onto the bond coating 34 by physical vapour deposition, usually electron beam physical vapour deposition. The oxide layer 36 forms on the bond coating 34 while the superalloy article 30 is heated up to the operating temperature in an electron beam physical vapour deposition chamber due to the presence of oxygen.

The superalloy article 30 is rotated in the electron beam physical vapour deposition chamber in the ceramic vapours to produce the ceramic thermal barrier coating 38. The layers 42 are produced by depositing the ceramic while the surface of the superalloy article 30 is substantially perpendicular to the flux of the ceramic vapours from the source of ceramic. The layers 44 are produced by depositing the ceramic while the surface of the superalloy article 30 is at an acute angle to the flux of the ceramic vapours from the source of ceramic. Thus the superalloy article 30 is periodically tilted between two positions while it is being rotated in the electron beam physical vapour deposition chamber. The layers are preferably produced while the surface of the superalloy article 30 is at an angle between 10° and 60°, more preferably between 20° and 45°, preferably 30°, to the flux of the ceramic vapours from the source of ceramic.

The layers 42 may be necessary to provide erosion resistance to the columnar ceramic thermal barrier coating 38 if the angle of inclination, alpha 2, is relatively low. At low angles of inclination, alpha 2, the columnar ceramic thermal barrier coating has very poor erosion resistance as seen from FIG. 7, however at low angles of inclination, alpha 2, the thermal conductivity is relatively good as seen from FIG. 8. It may be possible to simply have layers 44 arranged alternately with different angles of inclination, alpha 2, to the surface of the metallic substrate 30 and/or the same angles of inclination, alpha 2, to the surface of the metallic substrate but in opposite directions if the angles of inclination, alpha 2, are not too low.

Figure 3:
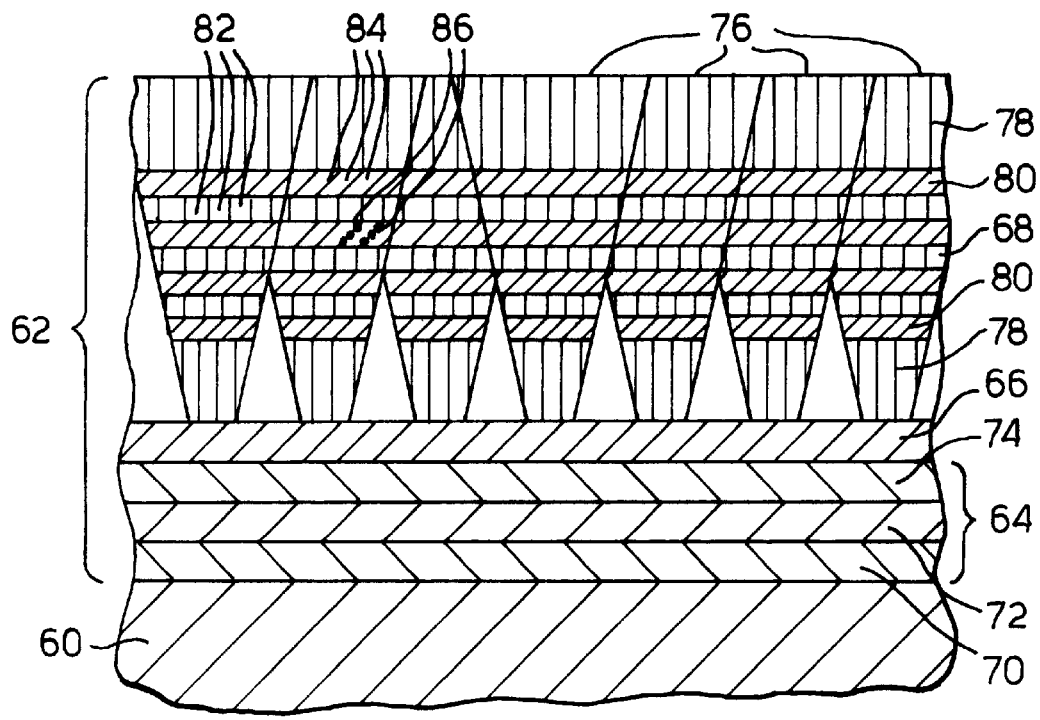
FIG. 3 is a cross-sectional diagrammatic view through a metallic article having another thermal barrier coating according to the present invention.

Referring to FIG. 3, illustrating a further embodiment of the present invention, there is shown part of a superalloy article 60 provided with a multi-layer thermal barrier coating indicated generally by numeral 62. It is shown in the as manufactured condition. The thermal barrier coating 62 comprises a bond coating 64 on the superalloy substrate 60, an oxide layer 66 on the bond coating 64 and a ceramic thermal barrier coating 68 on the oxide layer 66. The bond coating 64 is generally an aluminium containing alloy for example a MCrAlY alloy coating 70, where M is at least one of Ni, Co and Fe, with a platinum enriched MCrAlY layer 72 and a platinum aluminide layer 74 as described more fully in European patent application EP0718419A. The oxide layer 66 generally comprises alumina.

The ceramic thermal barrier coating 68 is similar to that described with reference to FIG. 2 and again comprises columnar ceramic grains 76 which extend substantially perpendicularly to the surface of the superalloy substrate 60. Furthermore it is seen that each columnar ceramic grain 76 comprises a plurality of layers 78 and 80. The sub grains 82 in the layers 78 extend substantially perpendicularly to the surface of the superalloy substrate 60 and the sub-grains 84 in the layers 80 extend at an acute angle to the surface of the superalloy substrate 60. Additionally voids 86, or pores, are formed between the adjacent sub-grains 84 in the layers 80. The differences in structure between the layers 78 and 80 produces interfaces which reduce the thermal conductivity of the ceramic thermal barrier coating 68. The thickness of the layers is selected to reduce either the phonon thermal conductivity or the photon thermal conductivity. Additionally the voids 86 between adjacent sub-grains 84 in the layers 80 reduce phonon thermal conductivity of the ceramic thermal barrier coating 68. The layers 78 and 80 are arranged alternately to provide good erosion resistance, with a thicker final layer 78.

The bond coating 64 is formed by depositing a MCrAlY alloy bond coating, then depositing platinum on the MCrAlY and then heat treating to diffuse the platinum into the MCrAlY.

Referring to FIG. 4, illustrating a further embodiment of the present invention, there is shown part of a superalloy article 90 provided with a multi-layer thermal barrier coating indicated generally by numeral 92. It is shown in the as manufactured condition. The thermal barrier coating 92 comprises a bond coating 94 on the superalloy substrate 90, an oxide layer 96 on the bond coating 94 and a ceramic thermal barrier coating 98 on the oxide layer 96. The bond coating 94 is generally a platinum enriched gamma and platinum enriched gamma prime layer on the superalloy as described more fully in European patent application EP0718420A. The oxide layer 96 generally comprises alumina.

The ceramic thermal barrier coating 98 is similar to that described with reference to FIG. 2 and again comprises columnar ceramic grains 100 which extend substantially perpendicularly to the surface of the superalloy substrate 90. Furthermore it is seen that each columnar ceramic grain 100 comprises a plurality of layers 102 and 104. The sub grains 106 in the layers 102 extend substantially perpendicularly to the surface of the superalloy substrate 90 and the sub-grains 108 in the layers 104 extend at an acute angle to the surface of the superalloy substrate 90. Additionally voids 110, or pores, are formed between the adjacent sub-grains 108 in the layers 104. The differences in structure between the layers 102 and 104 produces interfaces which reduce photon thermal conductivity of the ceramic thermal barrier coating 98 or the difference in structure between adjacent layers 104 produces interfaces which reduce phonon thermal conductivity depending on the thickness of the layers. Additionally the voids 110 between adjacent sub-grains 108 in the layers 104 reduce phonon thermal conductivity of the ceramic thermal barrier coating 98. The layers 104 are arranged alternately with the sub-grains 108 in alternate layers 104 extending at different acute angles to the surface of the superalloy article 90. In this example the sub-grains 108 are at the same angle but angled in the opposite direction. A thick layer 102 is provided on top of the layers for erosion resistance.

The bond coating 94 is formed by depositing platinum on the superalloy and heat treating to diffuse the platinum into the superalloy.

Referring to FIG. 5, illustrating a further embodiment of the present invention, there is shown part of a superalloy article 120 provided with a multi-layer thermal barrier coating indicated generally by numeral 122. It is shown in the as manufactured condition. The thermal barrier coating 122 comprises a bond coating 124 on the superalloy substrate 120 and a ceramic thermal barrier coating 126 on the bond coating 124. The bond coating 124 comprises an oxide layer generally of alumina.

The ceramic thermal barrier coating 126 is similar to that described with reference to FIG. 2 and again comprises columnar ceramic grains 128 which extend substantially perpendicularly to the surface of the superalloy substrate 120. Furthermore it is seen that each columnar ceramic grain 128 comprises a plurality of layers 130 and 132. The sub grains 134 in the layers 130 extend substantially perpendicularly to the surface of the superalloy substrate 120 and the sub-grains 136 in the layers 132 extend at an acute angle to the surface of the superalloy substrate 120. Additionally voids 138, or pores, are formed between the adjacent sub-grains 136 in the layers 132. The differences in structure between the layers 130 and 132 produces interfaces which reduce the thermal conductivity of the ceramic thermal barrier coating 126. The thickness of the layers is selected to reduce either the phonon thermal conductivity or the photon thermal conductivity. Additionally the voids 138 between adjacent sub-grains 136 in the layers 132 reduce phonon thermal conductivity of the ceramic thermal barrier coating 126. The layers 130 and 132 are arranged alternately to provide good erosion resistance, with a thicker final layer 130.

The bond coating 124 is formed by oxidising the superalloy article 120.

Figure 6:
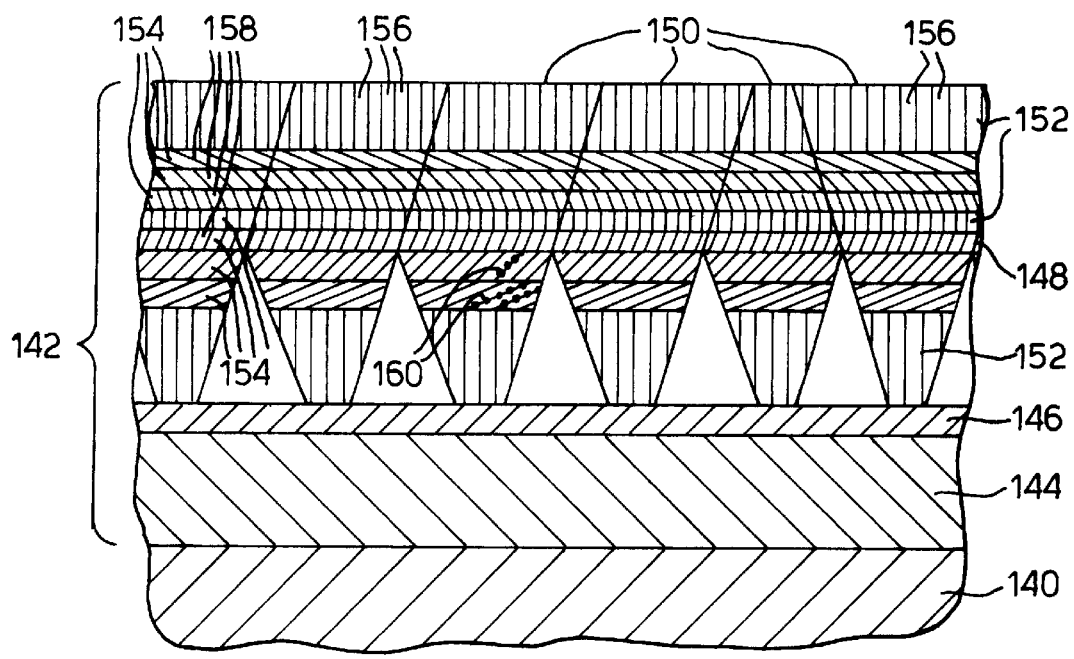
FIG. 6 is a cross-sectional diagrammatic view through a metallic article having a further thermal barrier coating according to the present invention.

Referring to FIG. 6, illustrating a further embodiment of the present invention, there is shown part of a superalloy article 140 provided with a multi-layer thermal barrier coating indicated generally by numeral 142. It is shown in the as manufactured condition. The thermal barrier coating 142 comprises a bond coating 144 on the superalloy substrate 140, an oxide layer 146 on the bond coating 144 and a ceramic thermal barrier coating 148 on the oxide layer 146. The bond coating 144 comprises a MCrAlY coating, where M is at least one of Ni, Co and Fe, and the oxide layer is generally alumina.

The ceramic thermal barrier coating 148 is similar to that described with reference to FIG. 2 and again comprises columnar ceramic grains 150 which extend substantially perpendicularly to the surface of the superalloy substrate 140. Furthermore it is seen that each columnar ceramic grain 150 comprises a plurality of layers 152 and 154. The sub grains 156 in the layers 152 extend substantially perpendicularly to the surface of the superalloy substrate 140 and the sub-grains 158 in the layers 154 extend at an acute angle to the surface of the superalloy substrate 140. Additionally voids 160, or pores, are formed between the adjacent sub-grains 158 in the layers 154. The differences in structure between the layers 152 and 154 produces interfaces which reduce the thermal conductivity of the ceramic thermal barrier coating 148. The thickness of the layers is selected to reduce either the phonon thermal conductivity or the photon thermal conductivity. Additionally the voids 160 between adjacent sub-grains 158 in he layers 154 reduce phonon thermal conductivity of the ceramic thermal barrier coating 148. The adjacent layers 154 have sub-grains 158 arranged at different acute angles, and it is to be noted that there is a gradual change in the angles of the sub-grains 158 from a minimum acute angle to a layer 152 which has sub-grains 156 at 90° and then a gradual change in the angles of the sub-grains 158 to a minimum acute angle.

Figure 7:
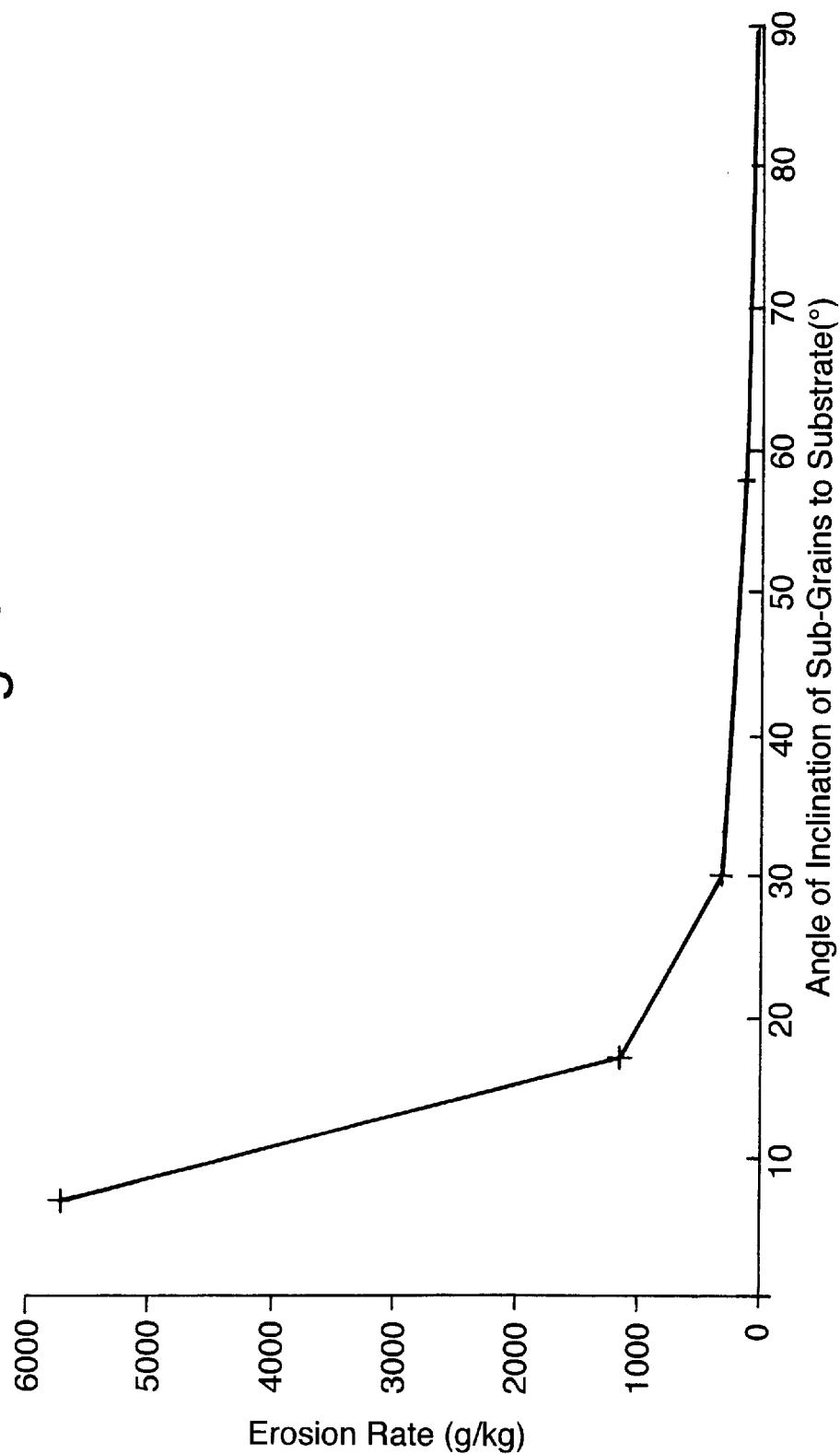
FIG. 7 is a graph showing erosion rate of the ceramic thermal barrier coating against angle of inclination of sub-grains in a columnar ceramic grain.

Referring to FIG. 7 which shows the erosion rate of the ceramic thermal barrier coating against angle of inclination of sub-grains in a columnar ceramic grain it is seen that the erosion rate is least for sub-grains arranged perpendicularly to the surface of the superalloy article and the erosion rate progressively increases as the acute angle decreases.

Referring to FIG. 8 which shows thermal conductivity of the ceramic thermal barrier coating against angle of inclination of sub-grains in a columnar ceramic grain it is seen that the thermal conductivity is greatest for sub-grains arranged perpendicularly to the surface of the superalloy article and the thermal conductivity progressively decreases as the acute angle decreases.

Thus ideally the ceramic thermal barrier coating should have sub-grains arranged at very small acute angles to the surface of the metallic article to minimise the thermal conductivity. However, this would mean that the erosion resistance of the ceramic thermal barrier coating would be very poor. Therefore, in order to obtain a reduction in thermal conductivity without reducing erosion resistance it is preferred to have layers with sub-grains at small acute angles to the surface of the metallic article and layers with sub-grains perpendicular to the surface of the metallic article.

It is preferred to use layers with sub-grains at an angle between 10° and 60°, more preferably between 20° and 45°, preferably 30°, to the surface of the metallic article and layers with sub-grains perpendicular to the surface of the metallic article. It is possible to have many different arrangements of the layers with the differently oriented sub-grains to obtain suitable erosion resistance and reduction in thermal conductivity.

It may be possible, in circumstances where erosion is not a problem, to have one or more layers with the sub-grains arranged at an acute angle to the surface of the metallic article.

In a series of experiments a thermal barrier coating was deposited onto samples of nickel alloy substrate. A MCrAlY bond coating was deposited onto samples of N75 nickel alloy substrate, an alumina layer was formed on the MCrAlY bond coating and a yttria stabilised zirconia ceramic thermal barrier coating was deposited onto the alumina layer by electron beam physical vapour deposition. The N75 nickel alloy comprises 19.5 wt % Cr, 0.4 wt % Ti, 0.1 wt % C balance Ni. The MCrAlY comprises 31.0–33.0 wt % Ni, 20.0–22.0 wt % Cr, 7.0–9.0 wt % Al, 0.35–0.65 wt % Y and the balance Co plus incidental impurities. The ceramic thermal barrier coating was deposited in two modes of operation onto the samples.

EXAMPLE 1

In the first mode of operation 64 micrometers of ceramic was deposited while rotating the superalloy substrate at a constant rotational speed of 45 revolutions per minute while the surface of the superalloy substrate was substantially perpendicular to the flux of the ceramic. In the second mode of operation 190 micrometers of ceramic was deposited while rotating the superalloy substrate at a constant rotational speed of 2.5 revolutions per minute while the surface of the superalloy substrate was moved constantly between an acute angle of +25° to the flux of the ceramic vapours from the source of ceramic and an acute angle of −25° to the flux of the ceramic vapours from the source of ceramic. The thermal conductivity of the ceramic thermal barrier coating was measured and it was 1.53 W/m/K.

EXAMPLE 2

In the first mode of operation 64 micrometers of ceramic was deposited while rotating the superalloy substrate at a constant rotational speed of 45 revolutions per minute while the surface of the superalloy substrate was substantially perpendicular to the flux of the ceramic. In the second mode of operation 190 micrometers of ceramic was deposited while rotating the superalloy substrate at a constant rotational speed of 45 revolutions per minute while the surface of the superalloy substrate was moved constantly between an acute angle of +25° to the flux of the ceramic vapours from the source of ceramic and an acute angle of −25° to the flux of the ceramic vapours from the source of ceramic. The thermal conductivity of the ceramic thermal barrier coating was measured and it was 1.66 W/m/K.

EXAMPLE 3

In the first mode of operation 26 micrometers of ceramic was deposited while rotating the superalloy substrate at a constant rotational speed of 6 revolutions per minute while the surface of the superalloy substrate was substantially perpendicular to the flux of the ceramic. In the second mode of operation 228 micrometers of ceramic was deposited while rotating the superalloy substrate at a constant rotational speed of 2.5 revolutions per minute while the surface of the superalloy substrate was moved constantly between an acute angle of +25° to the flux of the ceramic vapours from the source of ceramic and an acute angle of −25° to the flux of the ceramic vapours from the source of ceramic. The thermal conductivity of the ceramic thermal barrier coating was measured and it was 1.51 W/m/K.

EXAMPLE 4

In the first mode of operation 26 micrometers of ceramic was deposited while rotating the superalloy substrate at a constant rotational speed of 6 revolutions per minute while the surface of the superalloy substrate was substantially perpendicular to the flux of the ceramic. In the second mode of operation 228 micrometers of ceramic was deposited while rotating the superalloy substrate at a constant rotational speed of 45 revolutions per minute while the surface of the superalloy substrate was moved constantly between an acute angle of +25+ to the flux of the ceramic vapours from the source of ceramic and an acute angle of −25° to the flux of the ceramic vapours from the source of ceramic. The thermal conductivity of the ceramic thermal barrier coating was measured and it was 1.46 W/m/K.

The total thickness of the yttria stabilised zirconia ceramic for the four examples was 254 micrometers. Thus the sub-grains in examples 1 to 4 are arranged at an angle between 0 and 25° to the surface of the substrate. The thickness of the layers varies with the speed of rotation of the substrate. The angles of the sub-grains in adjacent layers changes gradually from 25° in one direction to 0° and to 25° in the other direction.

The thermal conductivity of 254 micrometers of yttria stabilised zirconia deposited by conventional electron beam physical vapour deposition is about 1.7 to 1.8 W/m/K. It can be seen that the coatings in Examples 1 to 4 have a reduction in thermal conductivity compared to that of yttria stabilised zirconia deposited by conventional electron beam physical vapour deposition.

Although in Examples 1 to 4 the ceramic was deposited while continuously moving the superalloy substrate between two positions which have different acute angles relative to the direction of flux of the ceramic vapours and passing through a third position where the superalloy substrate is perpendicular to the direction of flux of the ceramic vapours, it is possible for the superalloy substrate to be stopped, for a predetermined period of time, at each of the two positions which have different acute angles relative to the direction of flux of the ceramic vapours. It is also possible for the superalloy substrate to be stopped, for a predetermined period of time, in the third position. The ceramic may be any suitable ceramic for example zirconia, yttria stabilised zirconia, hafnia, ceria, alumina etc.

The ceramic thermal barrier coating is preferably deposited by a physical vapour deposition process, preferably electron beam physical vapour deposition or sputtering, however chemical vapour deposition or combustion chemical vapour deposition may be used, combustion chemical vapour deposition is disclosed in International patent application WO9721848A, published Jun. 19, 1997.

The surface of the ceramic thermal barrier coating may be polished to increase its surface smoothness particularly if it is to be used on the aerofoils of turbine blades or turbine vanes. The ceramic thermal barrier coating is preferably polished by vibropolishing using a porcelain polishing media sold under the trade name CP2 by Ceratex Engineering Ltd. The porcelain polishing media increases the surface smoothness of the ceramic thermal barrier coating without fracturing the columnar ceramic grains.

I claim:

1. A metallic article comprising a bond coating on the metallic article and a ceramic thermal barrier coating on the bond coating, the ceramic thermal barrier coating comprising a plurality of columnar grains extending substantially perpendicularly to the surface of the metallic article, each columnar grain having a plurality of layers having sub-grains extending at an acute angle to the surface of the metallic article to form voids between adjacent sub-grains, the voids being arranged at an acute angle to the surface of the metallic article and thereby reduce the thermal conductivity of the ceramic thermal barrier coating.

2. A metallic article as claimed in claim 1 wherein each columnar grain having at least one further layer having sub-grains extending perpendicularly to the surface of the metallic article, the at least one further layer having sub-grains extending perpendicularly to the surface of the metallic article being arranged further from the surface of the metallic article than the plurality of layers having sub-grains extending at an acute angle to the surface of the metallic article to increase the erosion resistance of the ceramic thermal barrier coating.

3. A metallic article as claimed in claim 2 wherein there are a plurality of layers having sub-grains extending at an acute angle to the surface of the metallic article to form voids between adjacent sub-grains and a plurality of further layers having sub-grains extending perpendicularly to the surface of the metallic article.

4. A metallic article as claimed in claim 3 wherein the layers having sub-grains extending at an acute angle to the surface of the metallic article to form voids between adjacent sub-grains are arranged alternately with the further layers having sub-grains extending perpendicularly to the surface of the metallic article.

5. A metallic article as claimed in claim 1 wherein the sub-grains in adjacent layers with sub-grains extending at an acute angle to the surface of the metallic article are arranged at different angles.

6. A metallic article as claimed in claim 5 wherein the sub-grains in adjacent layers with sub-grains extending at an acute angle to the surface of the metallic article are arranged at progressively decreasing acute angles.

7. A metallic article as claimed in claim 1 wherein the sub-grains in the plurality of layers having sub-grains extending at an acute angle to the surface of the metallic article are arranged at an angle between 10° and 60°.

8. A metallic article as claimed in claim 7 wherein the sub-grains in the plurality of layers having sub-grains extending at an acute angle to the surface of the metallic article are arranged at an angle between 20° and 45°.

9. A metallic article as claimed in claim 8 wherein the sub-grains in the plurality of layers having sub-grains extending at an acute angle to the surface of 30°.

10. A metallic article as claimed in claim 1 wherein the bond coating comprises an aluminium containing bond coating on the metallic article, the aluminium containing bond coating has an alumina surface layer, the ceramic thermal barrier coating is arranged on the alumina layer.

11. A metallic article as claimed in claim 10 wherein the aluminium containing bond coating comprises a MCrAlY bond coating or a diffusion aluminide coating.

12. A metallic article as claimed in claim 1 wherein the bond coating comprises a MCrAlY bond coating on the metallic article, a platinum enriched MCrAlY layer on the MCrAlY bond coating, a platinum aluminide layer on the platinum enriched MCrAlY layer, the platinum aluminide layer has an alumina surface layer, the ceramic thermal barrier coating is arranged on the alumina layer.

13. A metallic article as claimed in claim 1 wherein the metallic article has an alumina surface layer, the ceramic thermal barrier coating is arranged on the alumina layer.

14. A metallic article as claimed in any of claim 1 wherein the metallic article comprises a nickel superalloy article or a cobalt superalloy article.

15. A metallic article as claimed in claim 1 wherein the metallic article comprises a turbine blade or a turbine vane.

16. A metallic article as claimed in claim 1 wherein the ceramic thermal barrier coating comprises zirconia.

17. A metallic article as claimed in claim 16 wherein the zirconia is stabilised with yttria.

18. A method of applying a ceramic thermal barrier coating to a metallic article, comprising the steps of: forming a bond coating on the metallic article, applying a ceramic thermal barrier coating to the bond coating by vapour deposition such that a plurality of columnar grains extend substantially perpendicularly to the surface of the metallic article, the vapour deposition process including a first deposition mode comprising depositing the ceramic such that a plurality of layers are formed in each columnar ceramic grain, the plurality of layers having sub-grains extending at an acute angle to the surface of the metallic article to form voids between adjacent sub-grains, the voids being arranged at an acute angle to the surface of the metallic article and thereby reduce the thermal conductivity of the ceramic thermal barrier coating.

19. A method as claimed in claim 18 wherein the vapour deposition process includes a second mode comprising depositing the ceramic such that at least one further layer is formed in each columnar ceramic grain, the at least one further layer having sub-grains extending perpendicularly to the surface of the metallic article, the at least one further layer having sub-grains extending perpendicularly to the surface of the metallic article being arranged further from the surface of the metallic article than the plurality of layers having sub-grains extending at an acute angle to the surface of the article to increase the erosion resistance of the ceramic thermal barrier coating.

20. A method as claimed in claim 19 comprising depositing a plurality of layers having sub-grains extending at an acute angle to the surface of the metallic article to form voids between adjacent sub-grains and depositing a plurality of further layers having sub-grains extending perpendicularly to the surface of the metallic article.

21. A method as claimed in claim 20 comprising depositing the plurality of layers having sub-grains extending at an acute angle to the surface of the metallic article to form voids between adjacent sub-grains alternately with a plurality of further layers having sub-grains extending perpendicularly to the surface of the metallic article.

22. A method as claimed in claim 18 comprising depositing the sub-grains in adjacent layers with sub-grains extending at an acute angle to the surface of the metallic article at different angles.

23. A method as claimed in claim 22 comprising depositing the sub-grains in adjacent layers with sub-grains extending at an acute angle to the surface of the metallic article at progressively decreasing acute angles.

24. A method as claimed in claim 18 wherein the sub-grains in the plurality of layers having sub-grains extending at an acute angle to the surface of the metallic article are arranged at an angle between 10° and 60°.

25. A method as claimed in claim 24 wherein the sub-grains in the plurality of layers having sub-grains extending at an acute angle to the surface of the metallic article are arranged at an angle between 20° and 45°.

26. A method as claimed in claim 25 wherein the sub-grains in the plurality of layers having sub-grains extending at an acute angle to the surface of the metallic article are arranged at an angle of 30°.

27. A method as claimed in claim 18 comprising tilting the metallic article such that the surface of the metallic article is at an acute angle to the flux of ceramic vapour to produce a plurality of layers having sub-grains extending at an acute angle to the surface of the metallic article to form voids between adjacent sub-grains.

28. A method as claimed in claim 19 comprising arranging the metallic article such that the surface of the metallic article is perpendicular to the flux of ceramic vapour to produce layers having sub-grains extending perpendicularly to the surface of the metallic article.

29. A method as claimed in claim 18 comprising applying an aluminium containing bond coating on the metallic article and forming an alumina layer on the aluminium containing bond coating.

30. A method as claimed in claim 29 wherein the aluminium containing bond coating comprises a MCrAlY alloy, an aluminide or a platinum aluminide.

31. A method as claimed in claim 18 comprising applying a MCrAlY bond coating on the metallic article, forming a platinum enriched MCrAlY layer on the MCrAlY bond coating, forming a platinum aluminide layer on the platinum enriched MCrAlY layer, and forming an alumina surface layer on the platinum aluminide layer.

32. A method as claimed in claim 18 comprising forming an alumina surface layer on the metallic article.

33. A method as claimed claim 18 wherein the metallic article is formed from a nickel superalloy article or a cobalt superalloy article.

34. A method as claimed in claim 18 wherein the metallic article comprises a turbine blade or a turbine vane.

35. A method as claimed in claim 18 wherein the ceramic thermal barrier coating comprises zirconia.

36. A method as claimed in claim 35 wherein the ceramic thermal barrier coating comprises zirconia stabilised with yttria.

37. A method as claimed in claim 18 comprising physical vapour deposition.

* * * * *